United States Patent
Saijo et al.

(10) Patent No.: US 11,421,325 B2
(45) Date of Patent: Aug. 23, 2022

(54) METHOD FOR PRODUCING A PRINTED WIRING BOARD

(71) Applicant: C. Uyemura & Co., Ltd., Osaka (JP)

(72) Inventors: Yoshikazu Saijo, Osaka (JP);
Hisamitsu Yamamoto, Osaka (JP);
Nobuhiko Naka, Osaka (JP)

(73) Assignee: C. UYEMURA & CO., LTD., Osaka (JP)

( * ) Notice: Subject to any disclaimer, the term of this patent is extended or adjusted under 35 U.S.C. 154(b) by 0 days.

(21) Appl. No.: 16/881,427

(22) Filed: May 22, 2020

(65) Prior Publication Data

US 2020/0378008 A1    Dec. 3, 2020

(30) Foreign Application Priority Data

May 28, 2019    (JP) .............................. JP2019-099302

(51) Int. Cl.
*C23C 18/20*    (2006.01)

(52) U.S. Cl.
CPC ........ *C23C 18/204* (2013.01); *C23C 18/2046* (2013.01)

(58) Field of Classification Search
CPC .............. C23C 18/204; C23C 18/2046; C23C 18/2086; C23C 18/38; C23C 18/22; C23C 18/2033; H05K 3/181; H05K 3/0055; H05K 3/387; H05K 2203/1105; H05K 3/389; H05K 2203/0285; H05K 2203/0307; H05K 3/24; H05K 2203/072; H05K 3/002; H05K 2203/111; C25D 5/56; C25D 5/50; C25D 3/38; C25D 7/123
See application file for complete search history.

(56) References Cited

U.S. PATENT DOCUMENTS

| | | | |
|---|---|---|---|
| 3,767,538 A * | 10/1973 | Politycki | ............. C23C 18/2086 |
| | | | 205/167 |
| 4,664,995 A | 5/1987 | Horgan | |
| 4,748,104 A | 5/1988 | Ferrier | |
| 4,986,848 A | 1/1991 | Yamamoto et al. | |
| 5,534,172 A | 7/1996 | Perry et al. | |
| 5,648,200 A | 7/1997 | Letize et al. | |
| 8,344,057 B1 | 1/2013 | Hills et al. | |
| 10,138,558 B2 | 11/2018 | Saijo | |
| 2002/0008470 A1 | 1/2002 | Uegaki | |
| 2004/0048752 A1 | 3/2004 | Nguyen et al. | |
| 2005/0025960 A1 | 2/2005 | Levey et al. | |
| 2009/0192029 A1 | 7/2009 | Levey et al. | |
| 2009/0253573 A1 | 10/2009 | Levey et al. | |
| 2015/0072070 A1 | 3/2015 | Saijo et al. | |
| 2016/0184789 A1 | 6/2016 | Takagi | |
| 2016/0186326 A1 * | 6/2016 | Saito | ................... C23C 18/1608 |
| | | | 427/558 |
| 2020/0378008 A1 | 12/2020 | Saijo | |
| 2021/0289637 A1 * | 9/2021 | Saijo | ...................... H05K 3/002 |

FOREIGN PATENT DOCUMENTS

| | | | | |
|---|---|---|---|---|
| CA | 2 292 005 | | 6/2000 | |
| EP | 1 396 606 | | 3/2004 | |
| EP | 3 543 372 | | 9/2019 | |
| JP | 59-52701 | | 12/1984 | |
| JP | 1-219169 | | 9/1989 | |
| JP | 4-56776 | | 2/1992 | |
| JP | 2005-13983 | | 1/2005 | |
| JP | 2006-219727 | | 8/2006 | |
| JP | 2009270174 A | * | 11/2009 | |
| JP | 2013-129855 | | 7/2013 | |
| JP | 2015-71821 | | 4/2015 | |
| JP | 2018-80369 | | 5/2018 | |
| JP | 2018080369 A | * | 5/2018 | ............... H05K 3/18 |
| WO | 2016/129373 | | 8/2016 | |
| WO | 2017/191260 | | 11/2017 | |

OTHER PUBLICATIONS

International Search Report dated Oct. 24, 2017 in International (PCT) Application No. PCT/JP2017/033910.
Office Action dated May 10, 2022 in Korean Patent Application No. 10-2019-7010926, with machine English language translation.

* cited by examiner

*Primary Examiner* — Dah-Wei D. Yuan
*Assistant Examiner* — Nga Leung V Law
(74) *Attorney, Agent, or Firm* — Wenderoth, Lind & Ponack, L.L.P.

(57) ABSTRACT

A present invention provides a method for manufacturing a printed wiring board having excellent plating adhesion to a resin substrate having low surface roughness such as having surface roughness Ra of 0.2 µm or less, having excellent treating solution stability, and having high penetrability into the resin substrate. The method for manufacturing a resin substrate includes a step 1A or a step 1B; and a step 2 after the step 1A or the step 1B; and the steps are conducted before conducting electroless plating.

4 Claims, No Drawings

METHOD FOR PRODUCING A PRINTED WIRING BOARD

CROSS-REFERENCE TO RELATED APPLICATION

This application is related to and claims priority under 35 U.S.C. 119 to Japanese Patent Application No. 2019-099302, filed on May 28, 2019, incorporated herein by reference in its entirety.

TECHNICAL FIELD

The present invention relates to a method of manufacturing a printed wiring board.

BACKGROUND ART

Printed wiring boards used widely in electronics and other fields are usually produced by, for example, copper plating method. In the copper plating method, a resin substrate is procecced by swelling treatment, roughening treatment for etching a surface of the resin substrate by immersing the substrate in a roughening solution containing an oxidizing agent, reduction treatment for reducing oxides generated by roughening treatment (neutralization treatment), (optionally an ultrasonic treatment, a cleaning treatment), drying, soft etching, pickling, catalyst imparting, electroless copper plating, and electrolytic copper plating successively to obtain printed wiring board. The roughening solution, also known as a desmear solution, is used to remove resin scum (smear) generated in many holes (such as blind vias and through holes for connecting a plurality of conductors and a trench used for forming a circuit) provided on a printed wiring board and on the substrate surface, along with the formation of the holes. A surface treatment method including a series of processes such as the swelling treatment and the roughening treatment, a reduction treatment is called a desmear treatment method.

However, as printed wiring boards become highly functional and highly integrated, conventional desmear treatments cannot yield sufficient adhesion between a plating film and a printed wiring board (herein after may be called as plating adhesion).

The present inventors disclosed in JP2018-80369 (patent document 1) a production method for a printed wiring board having excellent plating adhesion. In this method, following two step treating process is conducted after reduction treatment and before electroless plating:

(1) First Treating Process

A treating process with a first treating solution having a pH of 7 or higher, the solution comprising: at least one selected from the group consisting of ethylene-based glycol ether represented by CmH(2m+1)-(OC$_2$H$_4$)n-OH, where m is an integer of 1 to 4, n is an integer of 1 to 4 and propylene-based glycol ether represented by CxH(2x+1)-(OC$_3$H$_6$)y-OH, where x is an integer of 1 to 4, y is an integer of 1 to 3.

(2) Second Treating Process

A treating process with a second treating solution having a pH of 7.0 or higher and containing an amine-based silane coupling agent, after the above first treating process.

Furthermore, a pretreatment solution for electroless plating used for treating a surface of a printed wiring board requires to have excellent penetrability into resin substrates. The present inventors disclosed in JP2015-71821A (patent document 2) a pretreatment solution having excellent plating adhesion between a resin substrate and a plating film and having excellent penetrability into resin substrates. That is, the present inventors discloses a pretreatment agent for electroless plating, comprising: a fluorine compound; a surfactant; and at least one solvent selected from ethylene-based glycol butyl ethers of formula: C$_4$H$_9$—(OC$_2$H$_4$)m-OH where m is an integer of 1 to 4, and propylene-based glycol butyl ethers of formula: C$_4$H$_9$—(OC$_3$H$_6$)n-OH where n is an integer of 1 to 4.

SUMMARY OF THE INVENTION

Technical Problem

In recent years, a printed wiring board has reduced its surface roughness Ra as the printed wiring board becomes highly functionalized and highly integrated, and the lower surface roughness Ra decreases plating adhesion. Reduced surface roughness Ra causes that anchor effect by its irregularities becomes too small to keep plating adhesion.

Furthermore, a pretreatment agent for electroless plating requires excellent penetrability into a resin substrate as described and excellent treating solution stability during operation (storage stability).

In view of the above, it is desired to provide a method for manufacturing a printed wiring board having these excellent properties even on a substrate having low surface roughness.

The present invention has been made in view of the above problem, and an object of the present invention is to provide a method for manufacturing a printed wiring board having excellent plating adhesion to a resin substrate having low surface roughness such as having surface roughness Ra of 0.2 µm or less, having excellent treating solution stability, and having high penetrability into a resin substrate.

Solution to the Problems

The method for manufacturing the printed wiring board according to the present invention, which has solved the above problems, is as follows:

[1] A method for manufacturing a printed wiring board by electroless plating on a resin substrate comprising:
  a step 1A or a step 1B;
  a step 2 after the step 1A or the step 1B; and before the electroless plating;
  wherein
  in the step 1A, irradiating ultraviolet ray having wave length of 350 nm or less to a surface of the resin substrate to yield surface roughness Ra of the surface to 0.2 µm or less;
  in the step 1B, subsequently swelling the resin substrate, roughening the resin substrate at 50° C. to 70° C. for 1 min. to 10 min., and neutralizing the resin substrate to yield surface roughness Ra of the surface to 0.2 µm or less;
  in the step 2, treating the resin substrate by a silane coupling agent having amino group; ethylene-based glycol butyl ethers represented by C$_4$H$_9$—(OC$_2$H$_4$) n-OH (n is an integer of 1 to 4), and/or propylene-based glycol butyl ethers represented by C$_4$H$_9$—(OC$_3$H$_6$)n-OH (n is an integer of 1 to 4) at pH 3 to 10.

[2] The method for manufacturing the printed wiring board according to above [1] further comprising:
  a heat treatment at 120° C. or higher after the step 2 and before the electroless plating.

Advantageous Effects of the Invention

The present invention provides a method for manufacturing a printed wiring board having excellent plating adhesion to a resin substrate having low surface roughness such as having surface roughness Ra of 0.2 µm or less, having excellent treating solution stability, and having excellent penetrability into the resin substrate.

DESCRIPTION OF EMBODIMENTS

The present inventors conducted a study to solve the above problem and reached the solution to the problem. That is, the present invention includes successively conducting following steps before conducting electroless plating:

a step 1A wherein irradiating ultraviolet ray having wave length of 350 nm or less to a surface of a resin substrate; or a step 1B wherein subsequently conducting swelling, roughening at 50° C. to 70° C. for 1 min. to 10 min., and neutralizing to a resin substrate; and a step 2 wherein treating the resin substrate by a silane coupling agent having amino group; ethylene-based glycol butyl ethers and/or propylene-based glycol butyl ethers described in the patent document 2 at pH 3 to 10.

Firstly explains background of the step 1A and the step 1B.

The step 1B modifies conditions of roughening treatment of conventional desmear treatments. In the present invention, swelling treatment, roughening treatment, and neutralization treatment are all together referred as desmear treatment. As disclosed in Examples of the patent document 1, conventional roughening treatment improves plating adhesion by roughening a Ra of a resin substrate to 0.3 µm to 0.4 µm by conducting roughing treatment at 80° C. for 15 minutes. However, the present inventors revealed that the above roughening treatment conditions hardly obtains excellent plating adhesion on a surface of a resin substrate having Ra of 0.2 µm or less. As a result of extensive studies of the present inventors, conducting desmear treatment including roughening treatment of processing a resin substrate at 50° C. to 70° C. for 1 min to 10 min yields desired Ra. In the step 1B, conditions of the roughening treatment is changed but conditions of swelling treatment and neutralization treatment is the same as the conventional conditions.

As to the step 1A, a method of the step 1A employs irradiation of ultraviolet ray instead of desmear treatment. The present inventors revealed that irradiation of ultraviolet ray to a resin substrates, as an alternative for desmear treatment, provides excellent plating adhesion without roughening a surface of the resin substrate.

The present invention provides excellent plating adhesion to a resin substrate. The production method of the present invention also recognized as, for examples, an electroless plating method or a plating adhesion improving method for improving the adhesion between a substrate and a plating film.

The present inventive method will be described in detail with a method for manufacturing a printed wiring board by copper plating as for example.

In the case of conducting the step 1B, a printed wiring board is produced by subjecting swelling treatment, roughing treatment at 50° C. to 70° C. for 1 min. to 10 min., neutralization treatment, optional ultrasonic treatment, optional cleaning treatment (called as conditioning, cleaning or the like), drying, soft etching, pickling, catalyst imparting, electroless copper plating and electrolytic copper plating. When further conducting the ultrasonic treatment and the cleaning treatment after the neutralization treatment, the above step is carried out after the ultrasonic treatment but before the cleaning treatment. The cleaning treatment may be carried out after the neutralization treatment without the ultrasonic treatment. In this case, the above step is carried out after the neutralization treatment but before the cleaning treatment.

In the case of conducting the step 1A, a printed wiring board is produced by subjecting irradiation of ultraviolet ray having its wave length of 350 nm or less to a surface of the resin substrate, and then optional ultrasonic treatment, optional cleaning treatment (called as conditioning, cleaning or the like), drying, soft etching, pickling, catalyst imparting, electroless copper plating and electrolytic copper plating. The step 1A requires no desmear treatment as conducted in the step 1B.

Hereinafter, the present inventive manufacturing method will be described in order of steps.

As described above, the present invention conducts the step 1A or the step 1B before conducting electroless plating. The steps ensures plating adhesion. The step 1A and the step 1B each controls the surface roughness Ra of 0.2 µm or less.

The step 1B will be described below.
(1) Step 1B

In the step 1B, a resin substrate is treated by swelling treatment, roughening treatment at 50° C. to 70° C. for 1 min. to 10 min., and neutralization treatment. The roughening treatment temperature exceeds 70° C. increases Ra. And longer processing time within the above temperature range increases Ra. The roughening treatment temperature is preferably 60° C.

An etchant for the roughening treatment is not particularly limited, and examples of the etchant include oxidants such as sodium permanganate, potassium permanganate, sodium chromate, and potassium chromate.

The feature of the step 1B resides in changing the roughening treatment conditions. And other conditions of swelling treatment and neutralization treatment may employ any common methods typically adopted in the art. Thus, the processes are not limited. Specifically, examples of the processes are as follows.

The swelling treatment is conducted to facilitate roughening of the substrate surface in the roughening treatment after the swelling. Examples of a swelling solution used in the swelling treatment include N-methyl-2-pyrrolidone, N,N-dimethylacetamide, N,N-dimethyl formamide, γ-butyrolactone, ethylene glycol monobutyl ether and the like. The swelling solution may be one kind or two or more kinds of them. The swelling treatment is preferably carried out by immersing a resin substrate in the swelling solution at a temperature of approximately 60° C. to 90° C. for 10 min. to 30 min.

A reducing agent used for the neutralization treatment (reduction treatment) is not particularly limited and the reducing agent may be any usually used reducing agents usually used in the neutralization treatment. Examples of the reducing agent include hydrogen peroxide, hydroxylammonium sulfate, glyoxylic acid; various amine compounds such as hydroxylamine sulfate, ethylenediamine, diethylenetriamine, triethylenetetramine, tetraethylenepentamine, monoethanolamine, diethanolamine, ethylenediaminetetraacetic acid and nitrilotriacetic acid. The reducing agent may be one kind or two or more kinds of them. The neutralization treatment is preferably carried out by immersing a resin substrate in the reducing agent at a temperature of about 20° C. to 60° C. for 1 min. to 10 min.
(2) Step 1A In the step 1A, irradiating of ultraviolet ray having its wave length of 350 nm or less to a surface of a resin substrates. Intensive studies by the present inventors reveal that ultraviolet ray irradiation having its wave length of over 350 nm lowers the plating adhesion (see also Examples below). The wave length is preferably 300 nm or less, and preferably 160 nm or more, and even more preferably 172 nm or more.

The irradiation time of the ultraviolet ray may be controlled appropriately to effectively exhibit the desired effect. The irradiation time is preferably 1 second to 300 seconds and more preferably 2 seconds to 20 seconds. Shorter irradiation time may not effectively exhibit the desired effect. Longer irradiation time may decrease the production efficiency.

According to the present invention, a surface roughness Ra of the resin substrate after the step 1A or the step 1B and before the step 2 is controlled to be 0.2 μm or less. Larger Ra disadvantages for achieving fine pattern. The surface roughness Ra is preferably 0.2 μm or less, and more preferably 0.15 μm or less.

The Ra is the value measured in the step 2 of the method for manufacturing a printed wiring board. The Ra was measured by using a laser microscope (Contour GT-X) manufactured by Bruker as described in Examples.

(3) Step 2

The step 2 is conducted after the above step. In the step 2, thus obtained resin substrate is processed at pH 3 to 10 by a treating solution containing a silane coupling agent having amino group; ethylene-based glycol butyl ethers represented by $C_4H_9$—$(OC_2H_4)$n-OH (n is an integer of 1 to 4), and/or propylene-based glycol butyl ethers represented by $C_4H_9$—$(OC_3H_6)$n-OH (n is an integer of 1 to 4).

Accordingly, the step 2 includes the silane coupling agent having amino group; and the ethylene-based glycol butyl ethers and/or the propylene-based glycol butyl ethers. Hereinafter, the ethylene-based glycol butyl ethers and/or the propylene-based glycol butyl ethers used in the present inventive step 2 may be referred all together as glycol butyl ether.

In the present invention, the amine based silane coupling agent and the glycol butyl ether may be referred all together as "pretreatment agent for electroless plating" or simply "treating solution". As demonstrated in Examples, the treating solution of the present invention exhibits excellent properties in both stability during operation (storage stability) and penetrability.

Examples of the amine based silane coupling agent include a silane coupling agent represented by a general formula of Y—R—Si—$(X)_3$, a silane coupling agent having a cyclic compound such as a benzene ring, a silane coupling agent having a heterocyclic compound containing one or more heteroatoms such as nitrogen.

In the silane coupling agent represented by the above general formula, X represents an alkoxy group, an acetoxy group, a chloro atom, etc; and Y represents an amino group. The amine-based silane coupling agent simultaneously contains a functional group Y (amino group) reactively bound to an organic material and a functional group X reactively bound to an inorganic material in the molecule, and silanol produced by hydrolysis reactively bound to inorganic material.

Among the silane coupling agents represented by the above general formula, preferred examples include 3-aminopropyltrimethoxysilane, 3-aminopropyltriethoxysilane, N-2-(aminoethyl)-3-aminopropylmethyl dimethoxysilane, N-2-(aminoethyl)-3-aminopropyltrimethoxysilane, 3-triethoxysilyl-N-(1,3-dimethyl-butylidene) propylamine, N-phenyl-3-aminopropyltrimethoxysilane, N-(vinylbenzyl)-2-aminoethyl-3-aminopropyltrimethoxysilane hydrochloride and the like.

Examples of the silane coupling agent having the above cyclic compound include N-phenyl-3-aminopropyltrimethoxysilane. A dissolution aid such as ethylene glycol is also used with the silane coupling agent. The treating solution without the dissolution aid decreases treating solution stability (see Examples).

Examples of the silane coupling agent having the above heterocyclic compound include, for example, 1-(3-triethoxysilylpropyl)-2-imidazoline. A dissolution aid such as ethylene glycol is also used with the silane coupling agent. The treating solution without the dissolution aid decreases treating solution stability (see Examples).

The glycol butyl ethers of the ethylene-based glycol butyl ether and/or the propylene-based glycol butyl ether are the same as those described in the Patent Document 2. Details are as follows.

The glycol butyl ether is a kind of glycol ether used as an organic solvent. Glycol ether is used as a solvent for paints and inks, for example. Examples of the glycol ether include ethylene glycol-based ethylene glycol (E.O. based), propylene glycol-based propylene glycol (P.O. based), and the like. Among the E.O. based glycol ether and the P.O based glycol ether, ethylene-based glycol butyl ether and propylene-based glycol butyl ether having a terminal hydrogen is substituted with a butyl group improves excellent penetrability.

As specifically shown in Examples, glycol ethers other than the glycol butyl ether specified in the present invention failed to achieve desired properties. For example, among the E.O. based glycol ethers, the comparative example using ethylene glycol-dimethyl ether having a methyl group instead of a butyl group had a reduced permeability.

Examples of the ethylene-based glycol butyl ethers include ethylene glycol butyl ether (n=1), diethylene glycol butyl ether (n=2), triethylene glycol butyl ether (n=3), and tetraethylene glycol butyl ether (n=4). Examples of the propylene-based glycol butyl ether include propylene glycol butyl ether (n=1), dipropylene glycol butyl ether (n=2), tripropylene glycol butyl ether (n=3), and tetrapropylene glycol butyl ether (n=4).

In the present invention, the butyl in the glycol butyl ether may be linear or branched.

Among these, preferable glycol butyl ether is the ethylene-based glycol butyl ethers, and more preferably diethylene glycol butyl ether, (eg, diethylene glycol-mono-n-butyl ether) for further improving penetrability.

The present invention allows to use one kind of the glycol butyl ether or two or more kinds of the glycol butyl ethers. Examples of the combined use of the glycol butyl ethers include a combination of two or more kinds of the ethylene-based glycol butyl ethers, a combination of two or more kinds of the propylene-based glycol butyl ethers, and a combination of two or more kinds of the ethylene-based glycol butyl ethers and the propylene-based glycol butyl ethers, respectively.

In the step 2, the pH of the treating solution is eventually required to be controlled within the range of 3-10. As demonstrated in Examples, the treating solution having pH outside the above range fails to obtain desired plating adhesion. The pH is preferably 3.5 to 9, and the more preferably 4.5 to 5.5.

The treating solution used in the step 2 may contain a pH adjuster as needed for adjusting the pH within the above range. The kind of the pH adjuster used in the present invention is not particularly limited as long as it can adjust the pH within the above range. Examples of the pH adjuster include amine compounds such as diethylenetriamine; sulfuric acid; and alkaline solutions such as NaOH.

The treating solution used in the step 2 contains the above amine based silane coupling agent having an amino group, the glycol butyl ether represented by the above formula, and the pH adjuster as necessary, and the residue: water. The treating solution contains no fluorine compound and no surfactant. Because the fluorine compounds and the surfactant do not improve the above effect if added.

A "total amount of the treating solution" means a total amount of the amine-based silane coupling agent, the glycol butyl ether, the pH adjuster added as necessary, and water in the present invention. The glycol butyl ether amount relative to the total amount of the treating solution (the glycol butyl ether amount is a single amount when one kind of glycol butyl ether is used, or a total amount when two or more kinds of glycol butyl ether are used) is 0.1 g/L or more and 500 g/L or less, and more preferably 10 g/L or more and 300 g/L or less. Lower than the above amount of the glycol butyl ether fails to exhibit the effect derived from the glycol butyl ether and resulted in lowering the penetrability. And more than the above amount of the glycol butyl ether saturates the effects derived from the glycol butyl ether and resulted in economically wasteful.

The amine-based silane coupling agent amount relative to the total amount of the treating solution (the amine-based silane coupling agent amount is a single amount when one kind of amine-based silane coupling agent is used, or a total amount when two or more kinds of amine-based silane coupling agent are used) is preferably 3 g/L or more and 500 g/L or less, and more preferably 5 g/L or more and 300 g/L or less. Lower than the above amount fails to exhibit the effect derived from the amine-based silane coupling agent and resulted in lowering the plating adhesion. And more than the above amount of the amine-based silane coupling agent saturates the effects derived from the glycol butyl ether and resulted in economically wasteful.

The pH adjuster amount relative to the total amount of the treating solution may be different based on a kind selected from the amine-based silane coupling agents, the glycol butyl ethers, and the pH adjusters respectively. The amount of diethylenetriamine as the pH adjuster is preferably 3 g/L or more and 50 g/L or less, and more preferably 5 g/L or more and 30 g/L or less.

In the step 2, treating the resin substrate by the glycol butyl ether at pH 3 to 10 means preferably that the substrate treated in the above step 1A or 1B is immersed in the above treating solution containing glycol butyl ether. Immersion conditions preferably includes, for example, temperature of the treating solution at 40° C. to 80° C. and immersing time of 1 minute to 20 minutes.

The patent document 1 discloses two step treating process in which a substrate is treaded with a specified glycol ether (a first treating solution) and then treated with a specified amine-based silane coupling agent (a second treating solution). The patent document 1 demonstrated that two step treating process of this order only exhibited an effect of the patent document 1. In the present invention, the step 2 enables to treat a resin substrate in one step by the treating solution containing both the glycol butyl ether and the amine-based silane coupling agent.

(4) Optional Heat Treatment at 120° C. or Higher

The present invention may conduct heat treatment at 120° C. or higher, if necessary, after the step 2 and before electroless plating. The heat treatment further improves the plating adhesion. The heat treatment temperature is preferably 130° C. or higher, and more preferably 140° C. or higher. The upper limit of the heat treatment temperature is preferably about 180° C. or lower in consideration of the glass transition temperature and the like. The heating time of the heat treatment is not particularly limited as long as the desired action is effectively exhibited, but the heating time is preferably controlled within the range of 5 min. to 30 min.

The present invention has features in the above steps and can employ any generally adopted methods in this technical field as steps other than the above steps. The general conditions are not limited but may be exemplified as follows.

The present invention employs any resins usually used for desmear treatment and the like. Examples of resins include epoxy resins widely used as electric insulating resins, an imide resin, a phenol formaldehyde resin, a novolac resin, a melamine resin, a polyphenylene ether resin, a bismaleimide-triazine resin, a siloxane resin, a maleimide resin, a polyetheretherketone resin, a polyetherimide resin, and a polyethersulfone. The present invention does not limit resins to the above, and may employ resins prepared by mixing two or more of the above examples at arbitrary ratio.

The ultrasonic treatment as necessary may be conducted after the step 1A or the step 1B to further improves the plating adhesion. Adjustments of the ultrasonic treatment include frequency control of preferably 20 kHz to 200 kHz and more preferably 24 kHz to 100 kHz. Frequency lower than the above may fail to obtain the above effect. Frequency over the above may bring lager damage to a substrate. Irradiation time of the ultrasonic may be controlled within 10 sec. to 10 min. Irradiation of the ultrasonic less than 10 seconds may fail to obtain the above effect. Irradiation of ultrasonic over 10 minutes may result in excessive etching of an inner layer metal.

A cleaning treatment may be performed after conducting the above step.

The cleaning treatment cleans a surface of a resin substrate by removing dusts from the surface. And the cleaning treatment imparts water wettability to a resin substrate to further improve adhesion between a plating film and the substrate. The present invention employs any cleaning solvents. Examples of the cleaning solvent includes a cleaner-conditioner containing at least both a nonionic surfactant and a cationic surfactant. Specifically, above surface treated resin substrate preferably is immersed in the cleaner-conditioner at about 40° C. for 5 min.

Plating to the substrate is conducted after above pre-plating treatment. The plating may employ any plating methods usually used for plating a substrate. Examples of plating include a semi-additive method or a full-additive method. The present invention can refer to the patent document 1 and JP2015-71821 for details of the plating treatment.

EXAMPLES

The present invention will hereinafter be described more specifically by way of Examples, but the present invention is not limited to the following Examples. The present invention can be put into practice after appropriate modifications or variations within a range meeting the gist described above and below, all of which are included in the technical scope of the present invention.

Example 1

Samples were prepared according to the procedures shown in Tables 1 and 2. And the usefulness of the step 1A (UV irradiation) and the step 2 specified in the present invention was examined with the samples.

A resin substrate laminated with an insulating resin (GL102) manufactured by Ajinomoto Fine-Techno Co., was irradiated with ultraviolet ray. Conditions of wave length of ultraviolet ray and irradiation time was changed as shown in Table 1. Comparison Samples without ultraviolet ray irradiation was prepared. Heat treatment at 160° C. for 15 min. was conducted as necessary.

Table 3 shows surface roughness Ra of the resin substrate after the above process. Ra was measured with a laser microscope (Contour GT-X) manufactured by Bruker.

Table 1 shows details of the step 2 ("treating solution" may include glycol ether and silane coupling agent). Various types of silane coupling agent are used in the examples. Table 1 shows the concentration of the glycol ether and the silane coupling agent in the treating solution. Table 1 shows pH of the treating solution. The pH of the solution was controlled as necessary by adding a pH adjuster shown in table 1. In table 1, "none" in "pH adjusting agent" column means that the pH was adjusted to the value shown in Table 1 without adding the pH adjuster. Comparison samples were prepared without adding either glycol ether or silane coupling agent.

Then thus obtained substrate was processed by cleaner-conditioner, soft etching, pickling, catalyst imparting by catalyst imparting process (predip activator, reducer, accelerator), electroless copper plating, drying heating treatment (150° C. for 30 min.) successively. After that, cleaning, pickling was conducted and then electrolytic copper plating with 2.5 A/dm$^2$ was conducted to form copper plating with its thickness of 25 μm. Thus obtained substrate was process by discoloration treatment, drying, heat treatment (200° C. for 45 min.) to obtain a sample.

Adhesion strength between a plating film and a resin substrate of the above obtained sample was measured as follows.

(Measurement of Adhesion Strength Between a Plating Film and a Resin Substrate)

A cut of 1 cm in width was made in each of the above samples, followed by 90° peel test according to the method as described in JIS-05012, "8.5 Plating Adhesion", to measure peel strength with Autograph AGS-X Series Precision Universal Tester available from Shimadzu Corporation.

Stability and Penetrability of each treating solution in Table 1 were evaluated as follows.

(Stability Evaluation)

In this example, the appearance of treating solution was visually confirmed to evaluate the stability.

(Penetrability Evaluation)

In this example, the penetrability of the treating solution was evaluated by the felt sedimentation method. A felt (JA 3t manufactured by Yoneshima Felt Sangyo Co., Ltd.) cut into a size of 20 mm long×20 mm wide×3 mm thick was prepared for the penetrability evaluation.

First, 100 mL of each of various treating solutions was poured into a 100 mL beaker, and heated to the treating temperature (40° C.) as shown in Table 3 below. Then, one felt cut piece was dropped from the position 20 to 30 mm higher than the surface of the treating solution, and time required for the felt cut piece to come in contact with the surface of the treating solution and leave the surface of the treating solution (start to settle) was measured. The felt cut piece will settle when the treating solution penetrates the felt cut piece, so that the treating solution exhibiting shorter time is evaluated as having more excellent penetrability.

The results are shown in Table 3.

TABLE 1

| | Step 1A | | Step 2 | | | | | | |
| | Irradiation of ultraviolet ray | | glycol ether | | | silane coupling agent | | | |
| No. | wave length | Irradiation time | base | type | concentration (g/L) | base | type | concentration (g/L) | adjuster pH | pH | heat treatment |
| 1 | 172 nm | 10 sec. | ethylene glycol-base | diethylene glycol- | 350 | amine base | 3-aminopropyltrimethoxysilane | 5 | none | 4.9 | 160° C., 15 min. |
| 2 | 185 nm | 30 sec. | ethylene glycol-base | mono-n-butyl ether | 350 | amine base | 3-aminopropyltrimethoxysilane | 5 | none | 4.9 | 160° C., 15 min. |
| 3 | 254 nm | 5 min. | | | 350 | amine base | 3-aminopropyltrimethoxysilane | 5 | none | 4.9 | — |
| 4 | 172 nm | 10 sec. | | | 350 | amine base | 3-aminopropyltrimethoxysilane | 5 | none | 4.9 | — |
| 5 | 172 nm | 10 sec. | | | 350 | amine base | N-phenyl-3-aminopropyltrimethoxysilane* | 5 | none | 4.9 | 160° C., 15 min. |
| 6 | 172 nm | 10 sec. | | | 350 | amine base | 1-(3-triethoxysilylpropyl)-2-imidazoline* | 5 | none | 4.9 | 160° C., 15 min. |
| 7 | 172 nm | 10 sec. | propylene glycol-base | propylene glycol-mono-n-butyl ether | 340 | amine base | N-2-(aminoethyl)-3-aminopropyltrimethoxysilane | 5 | none | 4.9 | 160° C., 15 min. |
| 8 | 172 nm | 10 sec. | | — | — | amine base | 3-aminopropyltrimethoxysilane | 5 | none | 4.9 | 160° C., 15 min. |
| 9 | 172 nm | 10 sec. | ethylene glycol-base | ethylene glycol-dimethyl ether | 350 | amine base | 3-aminopropyltrimethoxysilane | 5 | none | 4.9 | 160° C., 15 min. |
| 10 | — | — | ethylene glycol-base | diethylene glycol-mono-n-butyl ether | 350 | amine base | 3-aminopropyltrimethoxysilane | 5 | none | 4.9 | 160° C., 15 min. |
| 11 | 172 nm | 10 sec. | | | 350 | — | — | — | none | 4.9 | 160° C., 15 min. |
| 12 | 352 nm | 10 sec. | | | 350 | amine base | 3-aminopropyltrimethoxysilane | 5 | none | 4.9 | 160° C., 15 min. |
| 13 | 172 nm | 10 sec. | | | 350 | epoxy base | 3-glycidoxypropyltrimethoxysilane | 5 | none | 4.9 | 160° C., 15 min. |

TABLE 1-continued

| | Step 1A Irradiation of ultraviolet ray | | Step 2 | | | | | | | | |
|---|---|---|---|---|---|---|---|---|---|---|---|
| | | | glycol ether | | | silane coupling agent | | | | | |
| No. | wave length | Irradiation time | base | type | concentration (g/L) | base | type | concentration (g/L) | adjuster pH | pH | heat treatment |
| 14 | 172 nm | 10 sec. | | | 350 | amine base | 3-aminopropyltrimethoxysilane | 5 | sulfuric acid | 1.2 | 160° C., 15 min. |
| 15 | 172 nm | 10 sec. | | | 350 | amine base | 3-aminopropyltrimethoxysilane | 5 | NaOH | 10.5 | 160° C., 15 min. |
| 16 | 172 nm | 10 sec. | | | 350 | amine base | N-phenyl-3-aminopropyltrimethoxysilane** | 5 | none | 4.9 | 160° C., 15 min. |
| 17 | 172 nm | 10 sec. | | | 350 | amine base | 1-(3-triethoxysilylpropyl)-2-imidazoline** | 5 | none | 4.9 | 160° C., 15 min. |

*with using ethylene glycol as dissolution aid
**without using ethylene glycol as dissolution aid

TABLE 2

| step | name/conditions | concentration | treatment temp. (° C.) | treatment time (min.) |
|---|---|---|---|---|
| step 1A | See Table 1 for irradiation conditions of ultraviolet ray | | 25 | 10 sec. |
| step 2 | See Tables 1 and 2 | | 40 | 10 |
| drying | | | 60 | 10 |
| heat treatment as necessary | | | 160 | 15 |
| cleaner-conditioner | THRU-CUP MCD-PL, C. Uyemura & CO. | 50 mL/L | 40 | 5 |
| soft etching | sodium persulfate | 100 g/L | 25 | 2 |
| | sulfuric acid | 100 g/L | | |
| pickling | sulfuric acid | 100 g/L | 25 | 1 |
| predip | ALCUP MDP-2, C. Uyemura & CO. | 10 mL/L | 25 | 1 |
| | sulfuric acid | 3 g/L | | |
| activator | ALCUP MAT-SP, C. Uyemura & CO. | 50 mL/L | 40 | 5 |
| | 1N-NaOH | 40 mL/L | | |
| reducer | ALCUP MAB-4-A, C. Uyemura & CO. | 10 mL/L | 35 | 3 |
| | ALCUP MAB-4-C, C. Uyemura & CO. | 50 mL/L | | |
| | ALCUP MRD-2-C, C. Uyemura & CO. | 10 mL/L | | |
| accelerator | THRU-CUP MEL-3-A, C. Uyemura & CO. | 50 mL/L | 25 | 1 |
| electroless copper plating | THRU-CUP PEA-6-A, C. Uyemura & CO. | 100 mL/L | 36 | 15 |
| | THRU-CUP PEA-6-B-2X, C. Uyemura & CO. | 50 mL/L | | |
| | THRU-CUP PEA-6-C, C. Uyemura & CO. | 14 mL/L | | |
| | THRU-CUP PEA-6-D, C. Uyemura & CO. | 15 mL/L | | |
| | THRU-CUP PEA-6-E, C. Uyemura & CO. | 50 mL/L | | |
| drying | | | 150 | 30 |
| heat treatment | | | 150 | 10 |
| cleaning | THRU-CUP MSC-3-A, C. Uyemura & CO. | 100 mL/L | 40 | 5 |
| pickling | sulfuric acid | 100 g/L | 25 | 1 |
| copper plating | THRU-CUP ETN(2.5 A/dm$^2$), C. Uyemura & CO. | | 25 | 45 (plating thickness: 25 um) |
| discoloration treatment | THRU-CUP AT-21, C. Uyemura & CO. | 1 mL/L | 25 | 1 |
| drying | | | 60 | 10 |
| heat treatment | | | 200 | 45 |

TABLE 3

| No. | resin srface Ra | treating solution stability | treating solution penetrability felt sedimentation method | plating adhesion peel strength |
|---|---|---|---|---|
| 1 | 0.05 um | stable | 1 sec. or less | 650 gf/cm |
| 2 | 0.05 um | stable | 1 sec. or less | 600 gf/cm |
| 3 | 0.05 um | stable | 1 sec. or less | 640 gf/cm |
| 4 | 0.05 um | stable | 1 sec. or less | 500 gf/cm |
| 5 | 0.05 um | stable | 1 sec. or less | 680 gf/cm |
| 6 | 0.05 um | stable | 1 sec. or less | 660 gf/cm |
| 7 | 0.05 um | stable | 1 sec. or less | 650 gf/cm |
| 8 | 0.05 um | stable | 2 min. or more | 650 gf/cm |
| 9 | 0.05 um | stable | 1 min. 40 sec. | 650 gf/cm |
| 10 | 0.05 um | stable | 1 sec. or less | 200 gf/cm |
| 11 | 0.05 um | stable | 1 sec. or less | 80 gf/cm |
| 12 | 0.05 um | stable | 1 sec. or less | 220 gf/cm |
| 13 | 0.05 um | stable | 1 sec. or less | 120 gf/cm |
| 14 | 0.05 um | stable | 1 sec. or less | 250 gf/cm |
| 15 | 0.05 um | stable | 1 sec. or less | 350 gf/cm |
| 16 | 0.05 um | clouded after the first day | 1 sec. or less | 600 gf/cm |
| 17 | 0.05 um | clouded after the first day | 1 sec. or less | 540 gf/cm |

Results shown in table 3 leads to the following examination. Numbers of the examples are taken from Table 3.

Nos. 1 to 7 are examples of the present invention produced by the present inventive method in which each ethylene glycol-based (No. 1 to 6) and propylene glycol-based (No. 7) attains the peel strength of 500 gf/cm or more and evaluated as excellent plating adhesion. Also, all of the glycol butyl ethers used in the above examples had good stability and penetrability.

Comparative examples failing to fulfill any of the requirements of the present invention had the following problems.

No. 8 was prepared without glycol ether in the step 2, and No. 9 was prepared with small amount of the glycol butyl ether as compared with the specified amount of the present invention. Both examples showed lowered penetrability.

No. 10 was prepared without the step 1A, and showed lowered plating adhesion.

No. 11 was prepared without the amine-based silane coupling agent in the step 2, and showed lowered plating adhesion.

No. 12 was prepared with using longer wave length of ultraviolet ray, and showed lowered plating adhesion.

No. 13 was prepared with using epoxy-based silane coupling agent instead of using amine-based silane coupling agent, and showed lowered plating adhesion.

No. 14 was prepared with the treating solution having low pH and No. 15 was prepared with the treating solution having high pH. Both samples showed lowered plating adhesion.

No. 16 was prepared without adding the dissolution aid of the amine-based silane coupling agent used in No. 5. The treating solution became clouded on the first day after the construction bath.

No. 17 is prepared without adding the dissolution aid of the amine-based silane coupling agent used in No. 6. The treating solution became clouded on the first day after the construction bath.

Example 2

Samples were prepared according to the procedures shown in Tables 4 and 5. And the usefulness of the step 1B (modified desmear treatment) and the step 2 specified in the present invention was examined.

Table 4 shows the conditions of Step 1B and details of the treating solution used in Step 2. Table 4 shows the concentrations of the glycol ether and the silane coupling agent in the treatment liquid of each sample.

Table 4 shows the pH of the each treating solution. And no pH adjuster was added to the samples. Comparison samples without silane coupling agent were prepared.

In this example, a sample was prepared in the same manner as in Example 1 except that the sample was prepared according to the steps described in Table 5 in Example 1 described above, and various characteristics were evaluated.

Table 6 shows these results. The surface roughness Ra of each resin substrate shown in Table 6 is measured after the step 1B and before the step 2.

TABLE 4

| | | Step 2 | | | | | | | |
|---|---|---|---|---|---|---|---|---|---|
| | | glycol ether | | | silane coupling agent | | | | |
| No. | Step 1B desmear treatment | base | type | concentration (g/L) | base | type | concentration (g/L) | pH adjuster pH | heat treatment |
| 1 | 70° C., 10 min | ethylene glycol-base | diethylene glycol-mono-n-butyl ether | 350 | amine base | N-2-(aminoethyl)-3-aminopropylmethyl dimethoxysilane | 5 | none 4.9 | 160° C., 15 min. |
| 2 | 70° C., 10 min | | | 350 | — | — | — | none 4.9 | 160° C., 15 min. |
| 3 | 80° C., 20 min | | | 350 | amine base | 3-aminopropyltrimethoxysilane | 5 | none 4.9 | 160° C., 15 min. |

TABLE 5

| step | name | concentration | treatment temp. (° C.) | treatment time (min.) |
|---|---|---|---|---|
| step 1B (1) swelling | APPDES MDS-37, C. Uyemura & CO. | 500 mL/L | 70 | 10 |
| step 1B(2) roughing | MDE-40, C. Uyemura & CO. | 100 mL/L | 70 | 10 |
|  | ELC-SH, C. Uyemura & CO. | 140 mL/L |  |  |
| step 1B(3) neutralization | MDN-62, C. Uyemura & CO. | 100 mL/L | 35 | 5 |
| drying |  |  | 60 | 10 |
| step 2 | See Tables 4 and 6 |  | 40 | 10 |
| drying |  |  | 60 | 10 |
| heat treatment |  |  | 160 | 15 |
| cleaner-conditioner | THRU-CUP MCD-PL, C. Uyemura & CO. | 50 mL/L | 40 | 5 |
| soft etching | sodium persulfate | 100 g/L | 25 | 2 |
|  | sulfuric acid | 100 g/L |  |  |
| pickling | sulfuric acid | 100 g/L | 25 | 1 |
| predip | ALCUP MDP-2, C. Uyemura & CO. | 10 mL/L | 25 | 1 |
|  | sulfuric acid | 3 g/L |  |  |
| activator | ALCUP MAT-SP, C. Uyemura & CO. | 50 mL/L | 40 | 5 |
|  | 1N-NaOH | 40 mL/L |  |  |
| reducer | ALCUP MAB-4-A, C. Uyemura & CO. | 10 mL/L | 35 | 3 |
|  | ALCUP MAB-4-C, C. Uyemura & CO. | 50 mL/L |  |  |
|  | ALCUP MRD-2-C, C. Uyemura & CO. | 10 mL/L |  |  |
| accelerator | THRU-CUP MEL-3-A, C. Uyemura & CO. | 50 mL/L | 25 | 1 |
| electroless copper plating | THRU-CUP PEA-6-A, C. Uyemura & CO. | 100 mL/L | 36 | 15 |
|  | THRU-CUP PEA-6-B-2X, C. Uyemura & CO. | 50 mL/L |  |  |
|  | THRU-CUP PEA-6-C, C. Uyemura & CO. | 14 mL/L |  |  |
|  | THRU-CUP PEA-6-D, C. Uyemura & CO. | 15 mL/L |  |  |
|  | THRU-CUP PEA-6-E, C. Uyemura & CO. | 50 mL/L |  |  |
| drying |  |  | 150 | 30 |
| heat treatment |  |  | 150 | 10 |
| cleaning | THRU-CUP MSC-3-A, C. Uyemura & CO. | 100 mL/L | 40 | 5 |
| pickling | sulfuric acid | 100 g/L | 25 | 1 |
| copper plating | THRU-CUP ETN(2.5 A/dm$^2$), C. Uyemura & CO. |  | 25 | 45 (plating thickness: 25 um) |
| discoloration treatment | TRU-CUP AT-21, C. Uyemura & CO. | 1 mL/L | 25 | 1 |
| drying |  |  | 60 | 10 |
| heat treatment |  |  | 200 | 45 |

TABLE 6

| | | properties | |
|---|---|---|---|
| No. | resin surface Ra | treating solution stability | treating solution penetrability felt sedimentation method | plating adhesion peel strength |
| 1 | 0.08 um | stable | 1 sec. or less | 640 gf/cm |
| 2 | 0.08 um | stable | 1 sec. or less | 250 gf/cm |
| 3 | 0.35 um | stable | 1 sec. or less | 640 gf/cm |

Results shown in Table 6 leads to the following examination. Numbers of the examples are taken from Table 6.

No. 1 is an example of the present invention produced by the present inventive method which attains the peal strength of 600 gf/cm and attains excellent plating adhesion.

The glycol butyl ethers used in the above example had good stability and penetrability.

No. 2 was prepared without amine-based silane coupling agent in the step 2, and showed lowered penetrability.

No. 3 was prepared with desmear treatment with higher temperature and longer processing time (so called strong desmear treatment), and showed greater surface roughness Ra of the resin substrate.

The invention claimed is:

1. A method for manufacturing a printed wiring board by electroless plating on a resin substrate comprising:
    irradiating ultraviolet ray having wave length of 350 nm or less to a surface of the resin substrate to yield surface roughness Ra of the surface to 0.2 μm or less, or
    swelling the resin substrate, roughening the resin substrate at 50° C. to 70° C. for 1 min. to 10 min., and neutralizing the resin substrate to yield surface roughness Ra of the surface to 0.2 μm or less;
    treating the resin substrate by a treating solution containing a silane coupling agent having amino group and at least one selected from the group consisting of an ethylene-based glycol butyl ether represented by $C_4H_9$—$(OC_2H_4)_n$—OH, wherein n is an integer of 1 to 4, and a propylene-based glycol butyl ether represented by $C_4H_9$—$(OC_3H_6)_n$—OH, wherein n is an integer of 1 to 4, at pH 3 to 9;
    treating thus obtained resin substrate by heating at 120° C. or higher for 5 min. to 30 min. under atmospheric pressure; and then
    electroless plating the resin substrate.

2. The method for manufacturing the printed wiring board according to claim 1 further comprising:
    cleaning the heat treated resin substrate by immersed in a cleaner-conditioner before the electroless plating.

3. The method for manufacturing the printed wiring board according to claim 2 further comprising:
   soft etching the resin substrate after the cleaning; and
   pickling the soft etched substrate before the electroless plating.

4. The method for manufacturing the printed wiring board according to claim 3 further comprising:
   imparting a catalyst to the pickled resin substrate before the electroless plating.

* * * * *